United States Patent
Nagayama et al.

(10) Patent No.: US 8,475,622 B2
(45) Date of Patent: *Jul. 2, 2013

(54) METHOD OF REUSING A CONSUMABLE PART FOR USE IN A PLASMA PROCESSING APPARATUS

(75) Inventors: Nobuyuki Nagayama, Nirasaki (JP); Naoyuki Satoh, Nirasaki (JP); Keiichi Nagakubo, Nirasaki (JP); Kazuya Nagaseki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/524,895

(22) Filed: Jun. 15, 2012

(65) Prior Publication Data

US 2012/0258258 A1 Oct. 11, 2012

Related U.S. Application Data

(63) Continuation of application No. 12/813,819, filed on Jun. 11, 2010, now Pat. No. 8,221,579.

(60) Provisional application No. 61/228,642, filed on Jul. 27, 2009.

(30) Foreign Application Priority Data

Jun. 12, 2009 (JP) ................................. 2009-141317

(51) Int. Cl.
*C23F 1/00* (2006.01)
*H01L 21/306* (2006.01)

(52) U.S. Cl.
USPC .............. 156/345.1; 156/345.29; 156/345.35; 156/345.51

(58) Field of Classification Search
None
See application file for complete search history.

(56) References Cited

U.S. PATENT DOCUMENTS

| | | | |
|---|---|---|---|
| 6,394,026 B1 | 5/2002 | Wicker et al. | |
| 8,084,375 B2 * | 12/2011 | Koshiishi et al. | 438/800 |
| 8,221,579 B2 * | 7/2012 | Nagayama et al. | 156/345.1 |
| 2002/0006766 A1 * | 1/2002 | Haerle et al. | 451/39 |
| 2004/0261946 A1 | 12/2004 | Endoh et al. | |
| 2009/0151870 A1 * | 6/2009 | Urakawa et al. | 156/345.1 |

FOREIGN PATENT DOCUMENTS

JP 2005-64460 3/2005

* cited by examiner

*Primary Examiner* — Duy Deo
(74) *Attorney, Agent, or Firm* — Rothwell, Figg, Ernst & Manbeck, P.C.

(57) ABSTRACT

A method of reusing a consumable part for use in a plasma processing apparatus includes cleaning a surface of the consumable part made of SiC that has been eroded by a first plasma process performed for a specific period of time. The method further includes depositing SiC on the cleaned surface of the eroded consumable part by CVD. The method also includes remanufacturing a consumable part having a predetermined shape by machining the eroded consumable part on which the SiC is deposited for performing a second plasma process on a substrate by using the remanufactured consumable part.

6 Claims, 8 Drawing Sheets

METHOD OF REUSING A CONSUMABLE PART FOR USE IN A PLASMA PROCESSING APPARATUS

CROSS-REFERENCE TO RELATED APPLICATIONS

This application is a continuation of U.S. patent application Ser. No. 12/813,819 filed Jun. 11, 2010, which claims priorities to Japanese Patent Application No. 2009-141317 filed on Jun. 12, 2009 and U.S. Provisional Application No. 61/228,642 filed Jul. 27, 2009, the entire contents of each of which are incorporated herein by reference.

FIELD OF THE INVENTION

The present invention relates to a method of reusing a consumable part for use in a plasma processing apparatus.

BACKGROUND OF THE INVENTION

A plasma processing apparatus, which performs a predetermined plasma process on a substrate, e.g., a wafer, includes a chamber serving as a depressurized chamber for accommodating the wafer therein; a shower head through which a processing gas is introduced into the chamber; and a susceptor arranged in the chamber to face the shower head, the wafer being mounted on the susceptor and a high frequency power being supplied in the chamber through the susceptor. The processing gas introduced into the chamber is excited by the high frequency power to be converted to a plasma.

The susceptor includes a ring-shaped focus ring which surrounds a periphery of the mounted wafer. The focus ring is made of silicon (Si) like the wafer. In the chamber, a distribution region of plasma is extended to above the focus ring from above the wafer and a density of plasma at a peripheral portion of the wafer is maintained to be substantially identical to that at a center portion of the wafer. Accordingly, it is possible to allow the plasma process to be uniformly performed over the entire surface of the wafer W (see, e.g., Japanese Patent Application Publication No. 2005-064460 and corresponding U.S. Patent Application Publication No. 2004/0261946 A1).

During the plasma process, the focus ring is sputtered and eroded by positive ions of the plasma. If the focus ring is eroded, a top surface of the focus ring becomes lower than the top surface of the wafer, which results in an ununiform distribution of plasma on the wafer. It resultantly becomes difficult to perform the plasma process uniformly over the entire surface of the wafer W. Accordingly, the focus ring that has been eroded to a certain degree is required to be replaced. The replaced focus ring is disused.

In the meantime, the plasma processing apparatus includes other consumable parts made of silicon in addition to the focus ring. The consumable parts having an influence on the plasma process, which have been eroded to a certain degree, are required to be replaced like the eroded focus ring. The replaced consumable parts are also disused.

Such a consumable part made of silicon, such as the focus ring, is manufactured by cutting a silicon lump (bulk material), which requires a long manufacturing time. Accordingly, it may be a waste to scrap the consumable part that has been eroded to a certain degree.

SUMMARY OF THE INVENTION

In view of the above, the present invention provides a method of reusing a consumable part used in a plasma processing apparatus to reduce a waste.

In accordance with an embodiment of the present invention, there is provided a method of reusing a consumable part used in a plasma processing apparatus. The method includes forming a silicon carbide (SiC) lump by depositing SiC by chemical vapor deposition (CVD); manufacturing a consumable part used in the plasma processing apparatus by processing the SiC lump, the consumable part having a predetermined shape; firstly performing a plasma process on a substrate by using the manufactured consumable part; cleaning a surface of the consumable part that has been eroded by the plasma process performed for a specific period of time; depositing SiC on the cleaned surface of the eroded consumable part by CVD; remanufacturing a consumable part having the predetermined shape by processing the eroded consumable part having the surface on which the SiC is deposited; and secondly performing a plasma process on a substrate by using the remanufactured consumable part.

In accordance with another embodiment of the present invention, there is provided a method of reusing a consumable part used in a plasma processing apparatus. The method includes firstly performing a plasma process on a substrate by using a consumable part made of SiC; cleaning a surface of the consumable part that has been eroded by the plasma process performed for a specific period of time; depositing SiC on the cleaned surface of the eroded consumable part by CVD; remanufacturing a consumable part having the predetermined shape by processing the eroded consumable part having the surface on which the SiC is deposited; and secondly performing a plasma process on a substrate by using the remanufactured consumable part.

BRIEF DESCRIPTION OF THE DRAWINGS

The objects and features of the present invention will become apparent from the following description of embodiments, given in conjunction with the accompanying drawings, in which:

FIGS. 2A and 2B are enlarged views of a focus ring shown in FIG. 1, wherein FIG. 2A is a top view and FIG. 2B is a cross sectional view taken along line II-II of FIG. 2A;

FIGS. 3A and 3B are enlarged views showing an upper electrode plate shown in FIG. 1, wherein FIG. 3A is a top view and FIG. 3B is a cross sectional view taken along line III-III of FIG. 3A;

DETAILED DESCRIPTION OF THE EMBODIMENTS

An embodiment of the present invention will now be described with reference to the accompanying drawings which form a part hereof.

Figure 1:
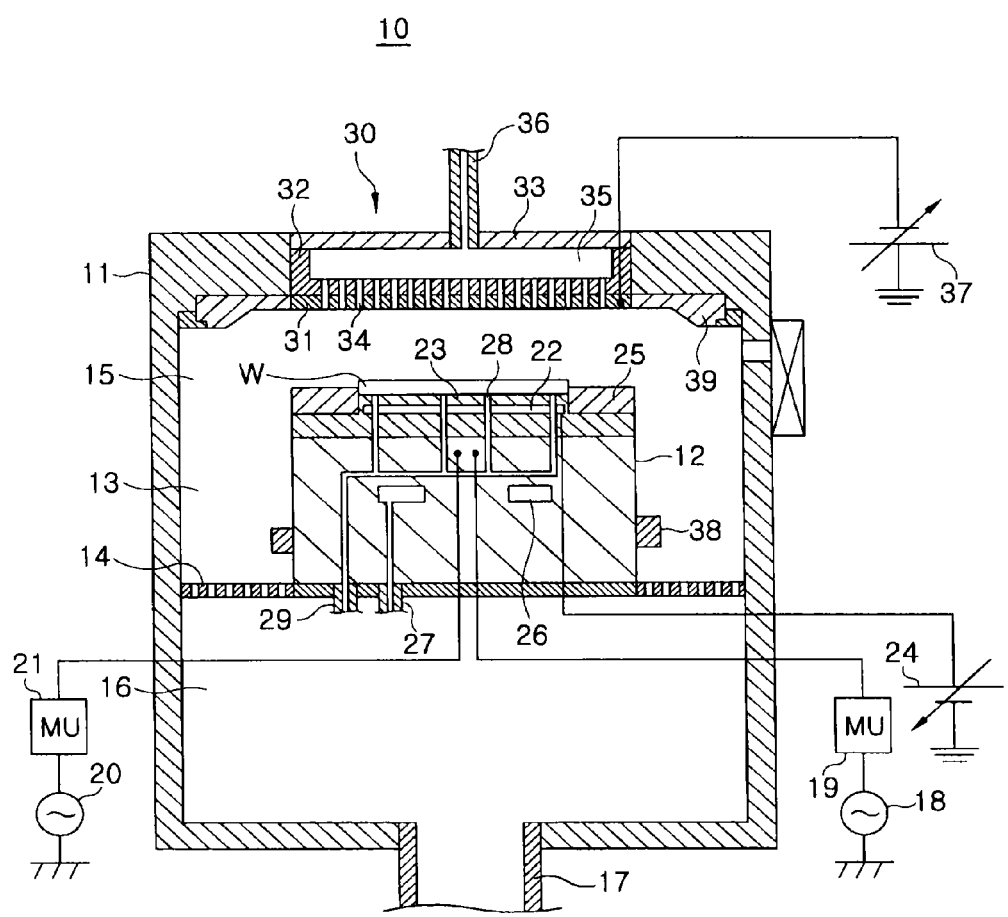
FIG. 1 is a cross sectional view schematically showing a configuration of a plasma processing apparatus including a consumable part to which a reusing method in accordance with an embodiment of the present invention is applied.

FIG. 1 is a cross sectional view schematically showing a configuration of a plasma processing apparatus 10 including a consumable part to which a reusing method in accordance with the embodiment of the present invention is applied. The plasma processing apparatus 10 performs a plasma etching process on a semiconductor device wafer W as a substrate (hereinafter, simply referred to as "wafer").

Referring to FIG. 1, the plasma processing apparatus 10 includes a chamber 11 for accommodating therein the wafer W having a diameter of, e.g., 300 mm; and a cylindrical susceptor 12 arranged in the chamber 11 to mount the wafer W thereon. The plasma processing apparatus 10 further includes a side exhaust passageway 13 defined between an inner wall of the chamber 11 and a side surface of the susceptor 12. A gas exhaust plate 14 is arranged in the side exhaust passageway 13.

The gas exhaust plate 14 includes a plate shaped member having a plurality of through holes and serves as a partition plate for separating an upper portion of the inside of the chamber 11 from a lower portion thereof. A plasma is generated in the upper portion (hereinafter, referred to as "processing space" 15) in the chamber 11 partitioned by the gas exhaust plate 14 as will be described later. Further, the lower portion (hereinafter, referred to as "gas exhaust space (manifold)" 16) in the chamber 11 is connected to a gas exhaust line 17 through which a gas in the chamber 11 is exhausted. The gas exhaust plate 14 captures or reflects the plasma generated in the processing space 15 to prevent the leakage of the plasma into the manifold 16.

A turbo molecular pump (TMP) and a dry pump (DP) (both not shown) are connected to the gas exhaust line 17 and depressurize the inside of the chamber 11 to a vacuum state. Specifically, the DP reduces the pressure inside the chamber from the atmospheric pressure state to an intermediate vacuum state (e.g., about $1.3 \times 10$ Pa (0.1 Torr) or less), and the TMP cooperates with the DP to reduce the pressure inside the chamber 11 from the intermediate vacuum state to a high vacuum state (e.g., about $1.3 \times 10^{-3}$ Pa ($1.0 \times 10^{-5}$ Torr) or less). In the meantime, the pressure inside the chamber 11 is controlled by an adaptive pressure control (APC) valve (not shown).

The susceptor 12 in the chamber 11 is connected to a first high frequency power supply 18 via a first matching unit (MU) 19 and also connected to a second high frequency power supply 20 via a second matching unit (MU) 21. A high frequency power for ion attraction having a relatively low frequency, e.g., about 2 MHz, is supplied from the first high frequency power supply 18 to the susceptor 12. Similarly, a high frequency power for plasma generation having a relatively high frequency, e.g., about 100 MHz, is supplied from the second high frequency power supply 20 to the susceptor 12. Accordingly, the susceptor 12 serves as an electrode. Furthermore, the first and the second matching unit 19 and 21 reduce reflection of the high frequency powers from the susceptor 12 to maximize the supply efficiency of the high frequency powers to the susceptor 12.

An electrostatic chuck 23 having therein an electrostatic electrode plate 22 is disposed on the susceptor 12. The electrostatic chuck 23 is configured by stacking an upper circular plate-shaped member on a lower circular plate-shaped member, wherein a diameter of the upper circular plate-shaped member is smaller than that of the lower circular plate-shaped member. Accordingly, a stepped portion is provided at a peripheral portion of the electrostatic chuck 23. In the meantime, the upper and the lower circular plate-shaped member of the electrostatic chuck 23 are made of ceramic.

The electrostatic electrode plate 22 is connected to a DC power supply 24. When a positive DC voltage is applied to the electrostatic electrode plate 22, a negative potential is generated on a surface (hereinafter, referred to as "backside") of the wafer W which faces the electrostatic chuck 23, and this causes a potential difference between the electrostatic electrode plate 22 and the backside of the wafer W. By a Coulomb force or a Johnson-Rahbeck force generated due to the potential difference, the wafer W is attracted and held on the upper circular plate-shaped member of the electrostatic chuck 23.

In addition, a focus ring 25 is mounted on a horizontal surface of the stepped portion of the electrostatic chuck 23 to surround the wafer W attracted to and held on the electrostatic chuck 23. The focus ring 25 is made of, e.g., silicon carbide (SiC). In other words, since the focus ring is made of a semiconductor material, the plasma distribution region extends to above the focus ring 25 as well as above the wafer W. Accordingly, the density of plasma at a peripheral portion of the wafer W can be maintained to be substantially identical to that at a central portion of the wafer W. This ensures the uniform plasma etching over the entire surface of the wafer W.

An annular coolant passage 26 is provided inside the susceptor 12, the annular coolant passage 26 extending, e.g., in a circumferential direction of the susceptor 12. A low-temperature coolant, e.g., cooling water or Galden (registered trademark), is supplied from a chiller unit (not shown) to the coolant passage 26 via a coolant line 27 to be circulated. The susceptor 12 cooled by the low-temperature coolant cools the wafer W and the focus ring 25 through the electrostatic chuck 23. Further, a sheet for improving a thermal conductivity may be provided on a backside of the focus ring 25. Accordingly, heat transfer from the focus ring 25 to the susceptor 12 is improved. As a result, it is possible to efficiently cool the focus ring 25.

A plurality of heat transfer gas supply holes 28 opens at a portion (hereinafter, referred to as "attraction surface") of the upper circular plate-shaped member of the electrostatic chuck 23 on which the wafer W is attracted and held. The heat transfer gas supply holes 28 are connected to a heat transfer gas supply unit (not shown) via a heat transfer gas supply line 29. The heat transfer gas supply unit supplies a heat transfer gas, e.g., helium (He) gas, into a gap between the attraction surface and the backside of the wafer W through the heat transfer gas supply holes 28. The helium gas supplied into the gap between the attraction surface and the backside of the wafer W efficiently transfers heat of the wafer W to the electrostatic chuck 23.

A shower head 30 is provided at a ceiling portion of the chamber 11 so as to face the susceptor 12. The shower head 30 includes an upper electrode plate 31, a cooling plate 32 that detachably holds the upper electrode plate 31, and a lid 33 for covering the cooling plate 32. The upper electrode plate 31 is a circular plate-shaped member having a plurality of gas holes 34 extending therethrough in a thickness direction thereof and is made of SiC as a semiconductor material. Moreover, a buffer space 35 is defined inside the cooling plate 32, and a processing gas inlet line 36 is connected to the buffer space 35.

In addition, a DC power supply 37 is connected to the upper electrode plate 31 of the shower head 30 and applies a negative voltage to the upper electrode plate 31. At this time, the upper electrode plate 31 emits secondary electrons to prevent the electron density on the wafer W from decreasing in the processing space 15. The emitted secondary electrons flow from the wafer W to a ground electrode (ground ring) 38 made of a semiconductor material, e.g., SiC or silicon, the ground electrode 38 being provided to surround the side surface of the susceptor 12 in the side exhaust passageway 13.

In the plasma processing apparatus 10, the processing gas supplied from the processing gas inlet line 36 to the buffer space 35 is introduced into the processing space 15 through the gas holes 34, and the introduced processing gas is excited and converted into a plasma by the high frequency power for plasma generation which is supplied from the second high frequency power supply 20 to the processing space 15 via the susceptor 12. Ions in the plasma are attracted toward the wafer W by the high frequency power for ion attraction which is supplied from the first high frequency power supply 18 to the susceptor 12, so that the wafer W is subjected to a plasma etching process.

The operation of components of the above-described plasma processing apparatus 10 is controlled based on a program, corresponding to the plasma etching process, by a CPU of a control unit (not shown) of the plasma processing apparatus 10.

Figure 2A:
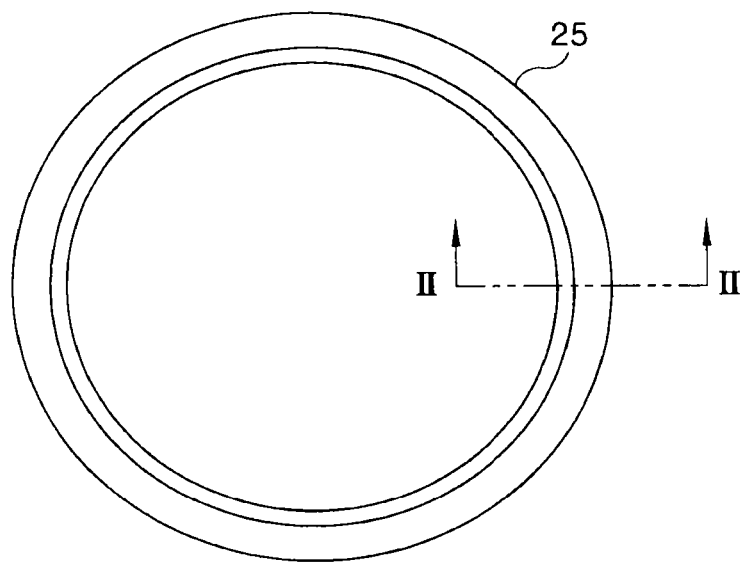
Figure 2B:
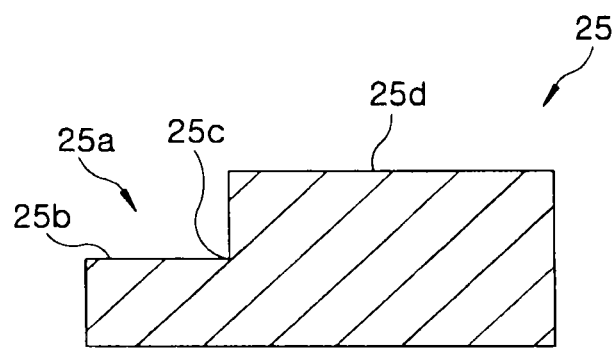

FIGS. 2A and 2B are enlarged views of the focus ring 25 shown in FIG. 1, wherein FIG. 2A is a top view and FIG. 2B is a cross sectional view taken along line II-II of FIG. 2A.

Referring to FIGS. 2A and 2B, the focus ring 25 is a ring-shaped member having a stepped portion 25a at an inner peripheral portion thereof and is formed of a single substance of SiC as described above. The stepped portion 25a is formed to correspond to the outer peripheral portion of the wafer W. When the wafer W is attracted and held on the attraction surface, a horizontal surface 25b of the stepped portion 25a is covered by the peripheral portion of the wafer W (see FIG. 1), while a corner 25c of the stepped portion 25a is not covered by the wafer W.

In the plasma etching process, the corner 25c and a top surface 25d of the focus ring 25 are exposed to the plasma to be sputtered by positive ions in the plasma.

Figure 3A:
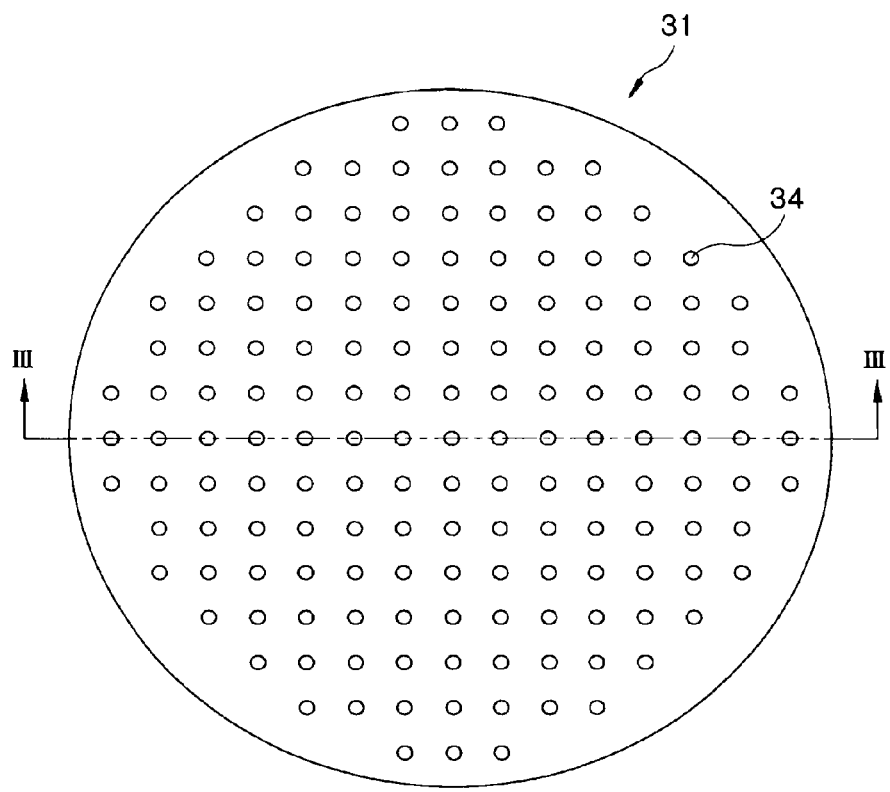
Figure 3B:
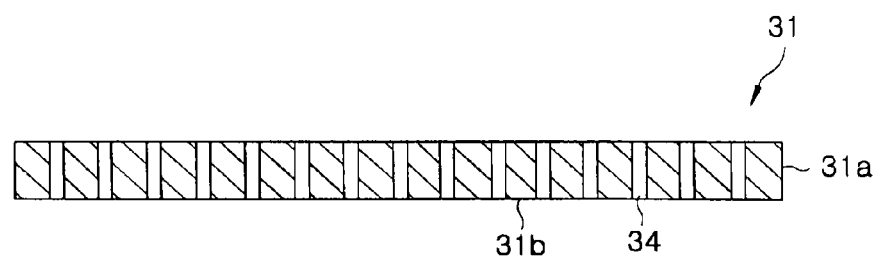

FIGS. 3A and 3B are enlarged views showing the upper electrode plate 31 shown in FIG. 1, wherein FIG. 3A is a top view and FIG. 3B is a cross sectional view taken along line III-III of FIG. 3A As shown in FIGS. 3A and 3B, the upper electrode plate 31 is formed of a circular plate-shaped member having a thickness of about 10 mm. The upper electrode plate 31 includes a plurality of gas holes 34 arranged therein with an equal pitch, the gas holes 34 extending through the upper electrode plate 31 in a thickness direction thereof. The gas holes 34 have a diameter of, e.g., about 0.5 mm and are formed by a machining process using a drill or the like.

When the upper electrode plate 31 is provided as a portion of the shower head 30 in the plasma processing apparatus 10, a side surface 31a of the upper electrode plate 31 is covered by an annular outer ring 39 made of, e.g., SiC, quartz, or silicon (see FIG. 1). A bottom surface 31b of the upper electrode plate 31, however, is exposed to the processing space 15. In other words, in the plasma etching process, the bottom surface 31b is exposed to the plasma to be sputtered by positive ions of the plasma.

As described above, the focus ring 25 and the upper electrode plate 31 are eroded by being sputtered by the positive ions. Accordingly, the focus ring 25 and the upper electrode plate 31 are made of SiC instead of silicon in the present embodiment. Since SiC can be deposited by chemical vapor deposition (CVD), the eroded focus ring 25 and the eroded upper electrode plate 31 can be restored (remanufactured) to have their original shapes by the deposition of SiC by CVD, so that they can be reused as will be described later.

Hereinafter, a reusing method of the present embodiment will be described.

FIGS. 4A to 4F show a process of reusing the focus ring 25.

Figure 4A:
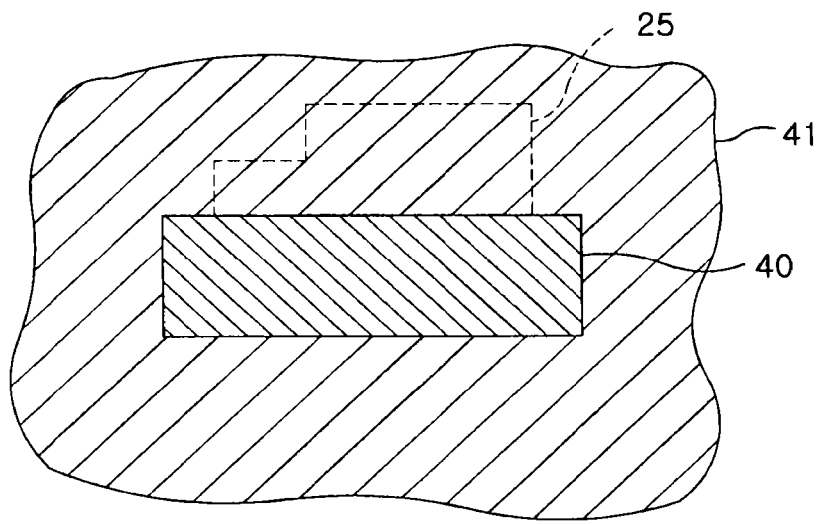
FIGS. 4A to 4F show a process of reusing a focus ring.

First, a ring-shaped graphite member 40 is provided as a nucleus and SiC is deposited around the ring-shaped graphite member 40 by CVD, to thereby form a ring-shaped SiC lump 41 (FIG. 4A) (SiC lump forming step). FIG. 4A shows a vertical cross section of the ring-shaped SiC lump 41. By CVD, SiC is isotropically deposited on the graphite member 40. To obtain the focus ring 25 without including the graphite member 40 by cutting the SiC lump 41, the deposition of SiC is continued until the thickness of the SiC lump 41 from the graphite member 40 to the top surface the SiC lump 41 becomes thicker than that of the focus ring 25.

Then, the focus ring 25 is obtained by cutting the SiC lump 41 such that the focus ring does not include the graphite member 40 (FIG. 4B) (consumable part manufacturing step) and the focus ring 25 is mounted on the susceptor 12 in the plasma processing apparatus 10. Thereafter, if the plasma etching process of the wafer W is repeated a predetermined number of times in the plasma etching apparatus 10 (first plasma processing step), the focus ring 25 is eroded. As described above, since the top surface 25d and the corner 25c of the focus ring 25 is not covered by the wafer W, the top surface 25d and the corner 25c are eroded (FIG. 4C).

Then, such an eroded focus ring 25' is taken out from the plasma processing apparatus 10 and a surface cleaning is performed on the surface of the eroded focus ring 25' (surface cleaning step).

The surface cleaning step includes, for example, an alkali cleaning step, an acid cleaning step, and a pure water ultrasonic cleaning step. Specifically, oil impurities or the like attached on the surface of the eroded focus ring 25' are first removed by an alkali cleaning with a caustic soda or NaOH solution. Here, the oil impurities may not be removed by the acid cleaning. Then, an acid cleaning with hydrofluoric acid (HF) or sulfuric acid ($H_2SO_4$) is performed on the eroded focus ring 25' which has been subjected to the alkali cleaning, so that silica and metallic impurities or the like which would not removed by the alkali cleaning are removed. Thereafter, the eroded focus ring 25' is transferred to a water tank filled with pure water and subjected to a pure water cleaning by using an ultrasonic wave.

In the surface cleaning step, a pure water cleaning step with or without the ultrasonic wave may be performed before the alkali cleaning step. Further, any one of the alkali, the acid, and the pure water ultrasonic cleaning step or a combination thereof may be performed. At this time, when the liquid chemical is required to be removed in the surface cleaning step, it is preferable to perform the pure water ultrasonic cleaning step as a final step.

Furthermore, when the eroded focus ring 25' is significantly polluted, $CO_2$ or SiC blast, sputtering by a plasma, and/or mechanical polishing may be performed to improve the cleaning efficiency or reduce the cleaning time. In this case, such steps are preferably performed before the alkali, the acid, and/or the pure water ultrasonic cleaning step.

Further, when the sheet for improving the thermal conductivity has been provided on the backside of the focus ring 25 as described above, it is necessary to remove the sheet in the surface cleaning step. Accordingly, in addition to the alkali, the acid, the pure water ultrasonic cleaning and/or the like, a heating treatment for heating the eroded focus ring 25' to, e.g., 300 to 400° C., $CO_2$ or SiC blast, sputtering by a plasma and/or the like may be performed to remove the sheet. Alternatively, the sheet may be removed when the alkali cleaning, the acid cleaning or the like is performed on the surface of the eroded focus ring 25'.

Figure 4B:
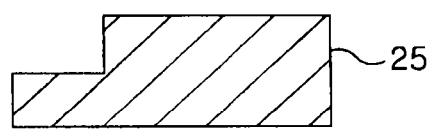
Figure 4C:
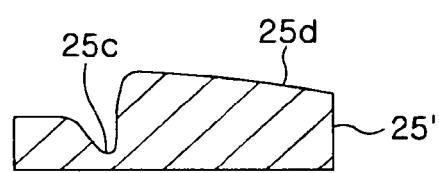
Figure 4D:
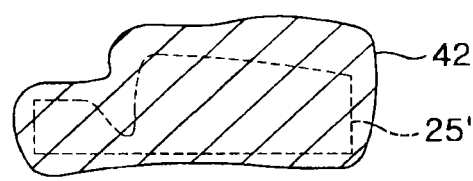
Figure 4E:
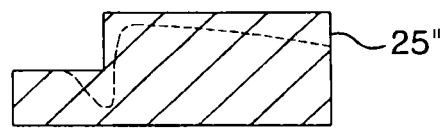
Figure 4F:
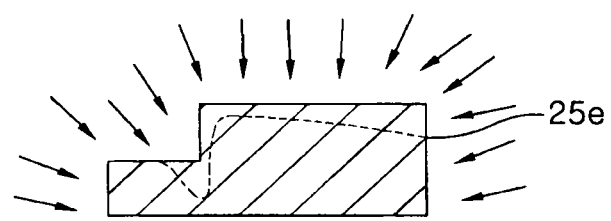

Thereafter, a new SiC lump 42 is formed by depositing SiC by CVD on the surface of the eroded focus ring 25' which has been subjected to the surface cleaning step (FIG. 4D). The deposition of SiC is continued until the SiC lump 42 is larger than the focus ring 25 (SiC deposition step).

Then, a focus ring 25" is remanufactured by machining the SiC lump 42 (FIG. 4E) (consumable part remanufacturing step). Thereafter, as necessary, the remanufactured focus ring 25" is placed in a high-temperature atmosphere of an annealing furnace and a source gas of SiC, e.g., a gaseous mixture of a silane-based gas and a carbon-based gas, is supplied to the annealing furnace. At this time, the source gas is thermally decomposed and attached and solidified on the surface of the remanufactured focus ring 25", thereby forming a SiC thin film having a thickness of several microns (see FIG. 4F) (surface processing step). The SiC thin film covers a border line 25e between the SiC portion deposited on the surface of the eroded focus ring 25' and the eroded focus ring 25' exposed at the surface of the remanufactured focus ring 25". Accordingly, it is possible to conceal the border line 25e, thereby making better the outer appearance of the remanufactured focus ring 25". In addition, the surface processing step may be omitted.

Then, the remanufactured focus ring 25" whose surface is coated with the SiC thin film is mounted on the susceptor 12 in the plasma processing apparatus 10. Thereafter, the plasma etching process performed on the wafer W is repeated a predetermined number of times in the plasma processing apparatus 10 (second plasma processing step).

The steps of performing the surface cleaning step on a surface of the eroded focus ring 25'; forming a new SiC lump (FIG. 4D); remanufacturing a focus ring 25" (FIG. 4E); coating a SiC thin film on a surface of the remanufactured focus ring 25" (FIG. 4F); and performing the plasma etching process on the wafer W after the remanufactured focus ring 25" is mounted, are sequentially repeated.

FIGS. 5A to 5F show a process of reusing the upper electrode plate 31.

Like in the process shown in FIGS. 4A to 4F, SiC is first deposited around a circular plate-shaped graphite member 43 by CVD, to thereby form a SiC lump 44 (FIG. 5A) (SiC lump forming step). To obtain the upper electrode plate 31 without including the graphite member 43 by cutting the SiC lump 44, the deposition of SiC is continued until the thickness of the SiC lump 44 from the graphite member 43 to the surface of the SiC lump 44 becomes thicker than that of the upper electrode plate 31.

Then, the upper electrode plate 31 is manufactured by cutting the SiC lump 44 to obtain a circular plate-shaped member having a predetermined size and forming a plurality of gas holes in the circular plate-shape member (FIG. 5B) (consumable part manufacturing step), and the manufactured upper electrode plate 31 is mounted, as a portion of the shower head 30, in the plasma processing apparatus 10.

Figure 5A:
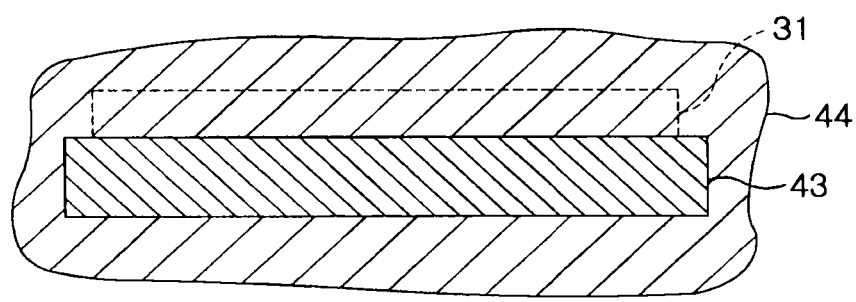
FIGS. 5A to 5F show a process of reusing an upper electrode plate.
Figure 5B:
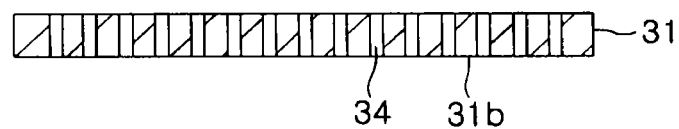
Figure 5C:
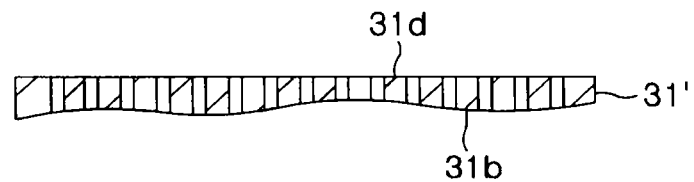

Thereafter, if the plasma etching process performed on the wafer W is repeated a predetermined number of times in the plasma etching apparatus 10 (first plasma processing step), the upper electrode plate 31 is eroded. As described above, since the bottom surface 31b of the upper electrode plate 31 is not covered by the outer ring 39, the bottom surface 31b is eroded (FIG. 5C). On the other hand, since a top surface 31d of the upper electrode plate 31 is brought into contact with the cooling plate 32, the top surface 31d is not eroded during the plasma etching process.

Figure 5D:
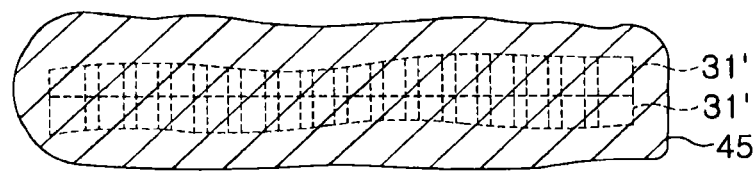
Figure 5E:
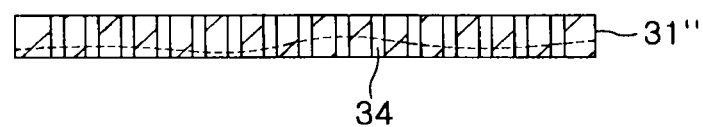
Figure 5F:
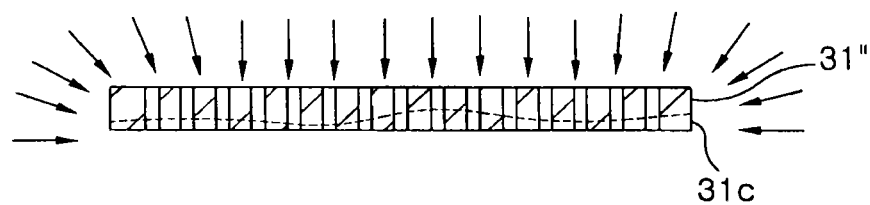

Then, such an eroded upper electrode plate 31' is taken out from the plasma processing apparatus 10 and, similarly to the process shown in FIGS. 4A to 4F, an surface cleaning is performed on the surface of the eroded upper electrode plate 31' by using, for example, alkali, acid, pure water, or the like (surface cleaning step). Thereafter, a new SiC lump 45 is formed by bringing two eroded upper electrode plates 31' into close-contact with each other, with top surfaces thereof contacted with each other, and depositing SiC on the surface of the closely contacted upper electrode plates 31' by CVD (FIG. 5D). Similarly, the deposition of SiC is continued until the SiC lump 45 is larger than two upper electrode plates 31 closely contacted with each other (SiC deposition step).

Then, an upper electrode plate 31" is remanufactured by machining the SiC lump 45 (FIG. 5E) (consumable part remanufacturing step). Thereafter, as necessary, a SiC thin film having a thickness of several microns is formed on the surface of the remanufactured upper electrode plate 31" in a high-temperature atmosphere by using a source gas of SiC (FIG. 5F) (surface processing step). The SiC thin film covers a border line 31c between the SiC portion deposited on the surface of the eroded upper electrode plate 31' and the eroded upper electrode plate 31' exposed at the surface of the remanufactured upper electrode plate 31". Accordingly, it is possible to conceal the border line 31c, thereby making better the outer appearance of the remanufactured upper electrode plate 31". In addition, the surface processing step may be omitted.

Then, the remanufactured upper electrode plate 31" whose surface is coated with the SiC thin film is mounted, as a portion of the shower head 30, in the plasma processing apparatus 10. Thereafter, the plasma etching process performed on the wafer W is repeated a predetermined number of times in the plasma processing apparatus 10 (second plasma processing step).

The steps of performing the surface cleaning step on the surface of the eroded upper electrode plate 31'; forming a new SiC lump 45 (FIG. 5D); remanufacturing an upper electrode plate 31" (FIG. 5E); coating a SiC thin film on the surface of the remanufactured upper electrode plate 31" (FIG. 5F); and performing the plasma etching process on the wafer W after the remanufactured upper electrode plate 31" is mounted, are sequentially repeated.

In accordance with the methods of reusing the focus ring 25 and the upper electrode plate 31 shown in FIGS. 4A to 5F, the SiC lumps 42 and 45 are formed by depositing SiC by CVD on the surfaces of the focus ring 25 and the upper electrode plate 31 eroded by the plasma etching process that is repeated a predetermined number of times; and the focus ring 25" and the upper electrode plate 31" are remanufactured by machining the SiC lumps 42 and 45, respectively. Accordingly, even when the focus ring 25 and the upper electrode plate 31 are eroded, it is possible to reuse the eroded focus ring 25' and the upper electrode plate 31' without scrapping them, which reduces a waste.

In accordance with the aforementioned reusing methods, the steps of performing the surface cleaning on the surface of the eroded focus ring 25' or the eroded upper electrode plate 31'; forming the new SiC lump 42 or 45 by CVD; remanufacturing the focus ring 25" or the upper electrode plate 31" by machining; coating the SiC thin film on the surface of the remanufactured focus ring 25" or the remanufactured upper electrode plate 31" as necessary; and performing the plasma etching process on the wafer W after the remanufactured focus ring 25" or the remanufactured upper electrode plate 31" is mounted, are sequentially repeated. Accordingly, it is possible to reuse the focus ring 25 and the upper electrode plate 31 for a long time, thereby reducing a waste efficiently.

In addition, in accordance with the above-mentioned reusing methods, the focus ring 25" or the upper electrode plate 31" is remanufactured and, then, the remanufactured focus ring 25" or the remanufactured upper electrode plate 31" is placed in the high-temperature atmosphere and the source gas of SiC is supplied to the high-temperature atmosphere, before the plasma process of a substrate using the remanufactured focus ring 25" or the remanufactured upper electrode plate 31". Since the source gas is thermally decomposed and solidified on the surface of the remanufactured focus ring 25" or the remanufactured upper electrode plate 31", the surface thereof is coated with the thin film of SiC. Accordingly, it is possible to conceal the border line between the SiC portion deposited by CVD and the eroded focus ring 25' or the eroded upper electrode plate 31', thereby making better the outer appearance of the remanufactured focus ring 25" or the remanufactured upper electrode plate 31".

Further, in accordance with the above-mentioned reusing methods, the surface cleaning is performed on the surface of the eroded focus ring 25' or the eroded upper electrode plate 31' before SiC is deposited by CVD. Impurities, attached on the surface of the focus ring 25 or the like, which are generated by fluorine ions and/or oxygen ions during the plasma etching process can be sufficiently removed therefrom by the surface cleaning since the impurities has a thickness of about 1 μm. Accordingly, it is possible to efficiently perform the subsequent SiC deposition by CVD while maintaining the quality of the remanufactured focus ring 25" or the remanufactured upper electrode plate 31". In addition, since the alkali cleaning, the acid cleaning, or the like can simply be performed, it is possible to easily perform the remanufacture of the focus ring 25" or the upper electrode plate 31".

The focus ring 25 and the upper electrode plate 31 are reused by using the above-mentioned reusing methods. The focus ring 25 or the upper electrode plate 31 eroded to a little degree is required to be replaced (for example, the upper electrode plate 31 eroded to, e.g., about 1 to 2 mm in a thickness direction is required to be replaced). Under the circumstance, it is possible to efficiently reduce the waste by reusing the eroded focus ring 25 or the eroded upper electrode plate 31.

In accordance with the aforementioned reusing methods, the alkali cleaning, the acid cleaning, or the like is performed on the surface of the eroded focus ring 25' or the eroded upper electrode plate 31'. Meanwhile, the sputtering is performed on the surface of the eroded focus ring 25' or the eroded upper electrode plate 31' by using the plasma before the alkali cleaning, the acid cleaning or the like when copper (Cu) of a Cu wiring layer or the like is etched in the plasma etching process and, thus, Cu ions are scattered and Cu or a Cu compound is attached on the surface of the focus ring 25 or the upper electrode plate 31. Moreover, $CO_2$ or SiC blast, sputtering by a plasma, and/or mechanical polishing may be performed on the surface of the eroded focus ring 25' or the eroded upper electrode plate 31' before the alkali cleaning, the acid cleaning or the like when a fluorine-containing gas or an oxygen-containing gas is employed as a processing gas and fluorine ions or oxygen ions are injected into the surface layer of the focus ring 25 or the upper electrode plate 31 and, thus, impurities are doped. Accordingly, the Cu or the Cu compound attached on the surface or the surface layer on which the impurities are doped can physically cut away and, therefore, it is possible to efficiently maintain the quality of the remanufactured focus ring 25" or the remanufactured upper electrode plate 31".

Moreover, a high resistance member is allowed to contain some impurities. Accordingly, if the focus ring 25 or the upper electrode plate 31 has high resistance, it is sufficient to perform the alkali cleaning, the acid cleaning, or the like on the surface of the focus ring 25 or the upper electrode plate 31 without sputtering the surface by using the plasma even when impurities are doped on the surface layer thereof.

The above-mentioned reusing method is applied to the focus ring 25 and the upper electrode plate 31. However, the reusing method can be applied to consumable parts formed by cutting a SiC lump made by the deposition by CVD. For example, the aforementioned reusing method can be applied to the ground electrode 38 and the outer ring 39, which are made of SiC.

As described above, the focus ring 25 or the like is formed by cutting the SiC lump formed by the deposition by CVD. Alternatively, a SIC lump may be formed by providing, e.g., a sintering material of SiC and/or graphite (carbon) as a nucleus and depositing SiC by CVD and a focus ring may be formed by cutting the SiC lump such that the focus ring includes the sintering material and/or the graphite. However, since the sintering material has coarser grains than those of a member formed by the deposition by CVD, particles are likely to be sputtered and scattered by the positive ions. Accordingly, when the focus ring or the like is eroded during the plasma etching process and the sintering material of SiC is exposed, particles may be generated.

Figure 7:
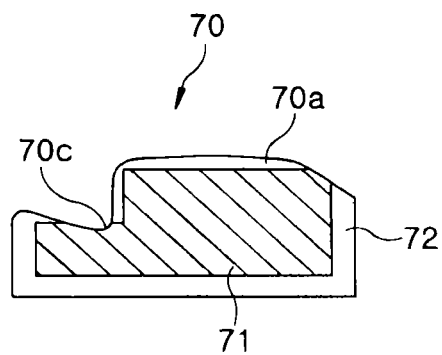
FIG. 7 shows a focus ring that is excessively eroded beyond a thickness of a SiC layer deposited by CVD.

FIG. 7 shows such an above problem, i.e., a focus ring that is excessively eroded beyond a thickness of a SiC layer deposited by CVD.

As shown in FIG. 7, in a focus ring 70, a top surface 70a and a corner 70c of a stepped portion which are not covered by the wafer during the plasma etching process are eroded and an SiC layer 72 deposited by CVD in the eroded portion is eroded. Accordingly, the core, e.g., a sintering SiC 71 is exposed. As such, if the sintering SiC 71 is exposed, particles are generated and scattered, so that the inside of the chamber is contaminated.

The SiC layer 72 deposited by CVD has a thickness, e.g., 100 μm and, thus, the time interval for replacing consumable parts becomes too short.

Meanwhile, it is required to stop the plasma etching process immediately before the SiC layer 72 deposited by CVD is completely eroded and replace the consumable parts in order to efficiently perform the plasma etching process without generation of the particles caused by the exposure of the core, i.e., the sintering SiC 71. To that end, it is necessary to accurately manage the timing for replacing the consumable parts, causing a troublesome operation.

Therefore, in case a SiC lump is made by providing a sintering material of SiC and/or graphite as a nucleus and depositing SiC by CVD and a focus ring is formed by cutting the SiC lump, it is necessary to obtain the focus ring without including the sintering material of SiC and/or graphite. In other words, since a focus ring including the sintering material of SiC and/or the graphite is not adequate for the plasma etching process, it is required to obtain the focus ring from a SiC portion deposited by CVD.

In accordance with the aforementioned reusing method, the SiC lump is formed by depositing the SiC on the surface of the core by CVD in the SiC lump forming step and the consumable part is manufactured by machining the SiC lump formed by the SiC lump forming step such that the consumable part does not include the core in the consumable part manufacturing step. Accordingly, the core, i.e., the graphite member 40, is not exposed by the erosion. Therefore, even though the consumable part (remanufactured focus ring 25") is manufactured by multiply depositing the CVD-SiC layers, it is possible to prevent particles from being generated and thus the inside of chamber from being polluted.

In addition, in accordance with the aforementioned reusing method, since the consumable part includes no core, the allowable erosion amount becomes, e.g., about 5 mm, which is a significantly increased value as compared with the conventional maximum allowable erosion amount, i.e., 100 μm. Accordingly, the consumable parts can be less frequently replaced. Further, the troublesome control for stopping plasma etching process immediately before the graphite member serving as the core is exposed becomes unnecessary, thereby improving the processing efficiency. Moreover, since no core is included, the shape of the consumable part is not limited to a specific shape in the re-manufacturing process as compared with the conventional consumable part; and it is possible to variously modify the shape of the remanufactured consumable part, for example, to reduce the diameter thereof, to partially change an angle of an inclined portion thereof, and differently cut an edge portion thereof as compared with the shape of the consumable part before being eroded, thereby improving the shape flexibility. For example, it becomes possible to obtain a remanufactured focus ring of a thickness of 3 mm by remanufacturing a focus ring having a thickness of 4 mm; or obtain a remanufactured focus ring of a diameter of 360 mm by remanufacturing a focus ring having a diameter of 380 mm In the case of conventionally reusing the graphite member 40 serving as the core, it is required to remove SiC remaining on the surface of the core. However, in the case of the aforementioned reusing method, it becomes unnecessary to perform such a removing operation.

In the present embodiments, the substrate to be subjected to the plasma etching process is not limited to the semiconductor device wafer. For example, the substrate may be one of various kinds of substrates, which can be used for a flat panel display (FPD) or the like including a liquid crystal display (LCD), a photomask, a CD substrate, a print substrate and the like.

In the above-mentioned reusing method, since the erosion of the consumable parts in the plasma processing step, the deposition of SiC in the deposition step, and the remanufacture of the consumable parts in the consumable part remanufacturing step are repeated, the remanufactured focus ring 25" and the remanufactured upper electrode plate 31" have a multi-layer structure in which the SiC layers deposited by CVD (hereinafter, referred to as "CVD-SiC layers") are successively deposited.

It has been confirmed that the consumable parts having the multi-layer structure in which the CVD-SiC layers are deposited accurately served as the components of the chamber.

Figure 6:
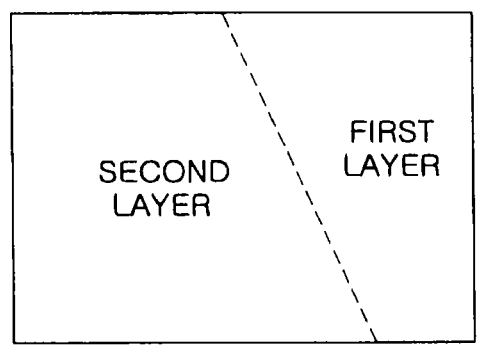
FIG. 6 is a schematic plan view showing a rectangular test piece having boundary between a first and a second-deposited CVD-SiC layer.

Specifically, a rectangular test piece (FIG. 6) having a boundary between a first-deposited CVD-SiC layer and a second-deposited CVD-SiC layer was formed by cutting a bulk sample made by depositing a plurality of CVD-SiC layers on the surface of a sintering SiC serving as the core. A plasma injection test for injecting a plasma was carried out on the test piece under predetermined conditions by using the plasma processing apparatus shown in FIG. 1. Then, a profiler was used to examine whether or not a stepped portion exists between the first and the second-deposited CVD-SiC layer.

Here, the plasma injection conditions were as follows. The pressure inside the chamber was 20 mTorr (2.66 Pa); a plasma-generating power of 500 W and a bias power of 3000 W were supplied; a gaseous mixture of $C_4F_8$ gas (140 sccm), CO gas (40 sccm), and Ar gas (600 sccm) was used as a processing gas for plasma generation; and a plasma injection time was 60 sec. Moreover, He gas serving as a heat transfer gas flowing through the heat transfer gas supply holes was set to have the pressure of 30 Torr (3.99 kPa) at a center portion and 10 Torr (1.33 kPa) at an edge portion.

After the plasma injection test, there was no stepped portion at the boundary between the first and the second-deposited CVD-SiC layer. As a result, it was confirmed that the erosion amount in the first-deposited CVD-SiC layer was the substantially same as that in the second-deposited CVD-SiC layer.

Further, it was checked that the surface of the first-deposited CVD-SiC layer had the substantially same state as that of the second-deposited CVD-SiC layer by taking SEM photography for each of the first and the second-deposited CVD-SiC layer to observe the states of the surfaces thereof after the plasma injection test. Resultantly, it was seen that there was no difference of erosion characteristics between the two layers.

Next, a reusing rate of the remanufacturing focus ring 25" remanufactured by the reusing method of the focus ring 25 shown in FIG. 4 was obtained. Here, the reusing rate indicates a percentage rate of the volume of the CVD-SiC layer deposited in the remanufacturing operation to the total volume of the remanufactured focus ring 25".

Specifically, the focus ring 25 shown in FIG. 4B before being eroded had the volume of, e.g., 147857 $mm^3$, and the eroded focus ring 25' shown in FIG. 4C had the volume of, e.g., 102087 $mm^3$. Moreover, the remanufactured focus ring 25" was remanufactured in the remanufacturing operation to have the same volume as that of the focus ring 25 before being eroded. Accordingly, a reusing rate R is computed by the following equation.

$$R = [1 - (102087/147857)] \times 100 = 31.0\%$$

Physically, the reusing rate R of a focus ring is obtained in the range between 0.1% and 90%. However, the reusing rate R is preferably in the range between 15% to 40%, especially 20% and 35%, in consideration of the actual productivity of the plasma etching process.

Next, the plasma etching processes were performed on a TEOS film of a sample wafer under the same conditions by using the plasma processing apparatus shown in FIG. 1 employing the remanufactured focus ring (F/R) 25" and the focus ring 25 before being eroded, respectively, to obtain an etching rate (E/R) and the number of particles having the size of 0.1 μm or greater attached on the surface of the sample wafer and observe a pollution state of the surface of the TEOS film and the effects of the eroded shapes of the two focus ring 25 and 25".

The results are shown in the following Table 1. The plasma processing conditions were identical to those of the aforementioned plasma injection test carried out by using the test piece.

TABLE 1

|  | F/R before eroded | | Remanufactured F/R | |
| --- | --- | --- | --- | --- |
|  | Before eroded | After eroded | Before eroded | After eroded |
| E/R of TEOS (μm/min) | 412.9 | 427.9 | 414.2 | 428.8 |
| Particle (0.1 μm or greater) | Within | No data | Within | Within |
| Pollution | Within |  | Within |  |

In Table 1, the focus ring 25 had the etching rates of 412.9 and 427.9 μm/min before and after being eroded, respectively, and the remanufactured focus ring 25" had the etching rates of 414.2 and 428.4 μm/min before and after being eroded, respectively. Resultantly, there was no significant difference therebetween. In addition, the numbers of the particles attached on the remanufactured focus ring 25" before and after being eroded are within the allowable level. Especially, any adverse effect was not observed.

From the above results, it is seen that, in the aforementioned reusing method, no adverse effect exists in the erosion rate between the remanufactured consumable parts and the consumable parts before being eroded, the surface state thereof after being eroded, the etching rate thereof before and after being eroded, and the atmosphere inside the chamber. Accordingly, there is no problem to use the remanufactured consumable parts as parts used inside the chamber.

While the invention has been shown and described with respect to the embodiments, it will be understood by those skilled in the art that various changes and modifications may be made without departing from the scope of the invention as defined in the following claims.

What is claimed is:

1. A method of reusing a consumable part for use in a plasma processing apparatus, the method comprising:
    cleaning a surface of the consumable part made of SiC that has been eroded by a first plasma process performed for a specific period of time;
    depositing SiC on the cleaned surface of the eroded consumable part by CVD;
    remanufacturing a consumable part having a predetermined shape by machining the eroded consumable part on which the SiC is deposited for performing a second plasma process on a substrate by using the remanufactured consumable part.

2. The method of claim 1, wherein the cleaning, the depositing and the remanufacturing are repeated.

3. The method of claim 1, further comprising:
    placing the remanufactured consumable part in a high-temperature atmosphere and supplying a source gas of SiC to the high-temperature atmosphere, between the remanufacturing and the second plasma process performing.

4. The method of claim 1, wherein the surface of the eroded consumable part is cleaned by using a liquid chemical in the cleaning.

5. The method of claim 1, wherein a sputtering is performed on the surface of the eroded consumable part by using a plasma in the cleaning.

6. The method of claim 1, wherein the consumable part is a focus ring or an electrode plate having a plurality of gas holes extending therethrough.

* * * * *